US006208946B1

(12) United States Patent
Arakawa et al.

(10) Patent No.: US 6,208,946 B1
(45) Date of Patent: Mar. 27, 2001

(54) HIGH SPEED FOURIER TRANSFORM APPARATUS

(75) Inventors: Norio Arakawa; Hiroyuki Konno, both of Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/109,344

(22) Filed: Jun. 30, 1998

(30) Foreign Application Priority Data

Sep. 30, 1997 (JP) .................................................. 9-266347

(51) Int. Cl.[7] ............................. G06F 15/00; G06F 19/00
(52) U.S. Cl. ......................... 702/77; 702/75; 708/405; 708/406
(58) Field of Search ..................... 702/75, 76, 77, 702/124, 126; 708/405, 406; 324/76.115, 76.16, 76.21

(56) References Cited

U.S. PATENT DOCUMENTS

| 4,067,060 | * | 1/1978 | Poussart et al. ................. 702/77 |
| 4,293,921 | * | 10/1981 | Smith, Jr. ........................... 708/405 |
| 4,321,680 | * | 3/1982 | Bertrand et al. ....................... 702/77 |
| 4,435,774 | * | 3/1984 | Claasen et al. ..................... 708/405 |
| 4,587,626 | * | 5/1986 | Gray .................................... 708/405 |
| 4,604,721 | * | 8/1986 | Gray .................................... 708/406 |
| 4,703,433 |   | 10/1987 | Sharrit . |
| 4,965,761 | * | 10/1990 | Schlunt .............................. 708/405 |

* cited by examiner

Primary Examiner—Marc S. Hoff
Assistant Examiner—Bryan Bui
(74) Attorney, Agent, or Firm—Muramatsu & Associates (57) ABSTRACT

A high-speed discrete Fourier transform (DFT) apparatus utilizes a processor operating in parallel with data acquisition to calculate terms of a Fourier transform corresponding to the incoming data. Since the processor calculates the Fourier terms in real-time, overall transformation time is substantially reduced and is limited by only the data acquisition time. In another aspect, substantial reduction of the number of computations are achieved by transforming the plurality of terms in Fourier equations at the same time. In a further aspect, the high-speed DFT is advantageously applied to a network analyzer which obtains a transfer function of a device in a frequency domain and converts the transfer function to a time domain response to a simulated test signal.

8 Claims, 8 Drawing Sheets

$$x(0) = X(0)e^{j2\pi 0 \cdot 0/N} + X(1)e^{j2\pi 0 \cdot 1/N} + X(2)e^{j2\pi 0 \cdot 2/N} + \ldots + X(N-1)e^{j2\pi 0 \cdot (N-1)/N}$$

$$x(1) = X(0)e^{j2\pi 1 \cdot 0/N} + X(1)e^{j2\pi 1 \cdot 1/N} + X(2)e^{j2\pi 1 \cdot 2/N} + \ldots + X(N-1)e^{j2\pi 1 \cdot (N-1)/N}$$

$$x(2) = X(0)e^{j2\pi 2 \cdot 0/N} + X(1)e^{j2\pi 2 \cdot 1/N} + X(2)e^{j2\pi 2 \cdot 2/N} + \ldots + X(N-1)e^{j2\pi 2 \cdot (N-1)/N}$$

$$x(N-1) = X(0)e^{j2\pi(N-1)\cdot 0/N} + X(1)e^{j2\pi(N-1)\cdot 1/N} + X(2)e^{j2\pi(N-1)\cdot 2/N} + \ldots + X(N-1)e^{j2\pi(N-1)\cdot(N-1)/N}$$

HIGH SPEED FOURIER TRANSFORM APPARATUS

FIELD OF THE INVENTION

This invention relates to a high-speed Fourier transform apparatus preferably used in test instruments such as network analyzers and spectrum analyzers, and more particularly, to a high-speed Fourier transform apparatus which performs a discrete Fourier transform in a parallel fashion.

BACKGROUND OF THE INVENTION

Fourier transform technology, for example FFT (Fast Fourier Transform), is widely used in test instruments such as network analyzers and spectrum analyzers as a means for analyzing the response of a device, the frequency spectrum of an incoming signal and the like. For example, such a Fourier transform process is performed on time domain data that is obtained by measuring an incoming signal in a predetermined time interval. Such test instruments convert the time domain data to frequency domain data and analyze the frequency components in the frequency domain or obtain the frequency spectrum of the incoming signal.

Alternatively, frequency domain data may be converted to time domain data through a Fourier transform process (or an inverse Fourier transform process). For example, in measuring a communication device such as a filter or other device under test (DUT), a network analyzer provides a frequency swept signal to the DUT and measures a resultant frequency domain signal in a predetermined frequency step. Based on the measured data, the network analyzer calculates and displays various parameters including transfer functions, reflection coefficients, phase shifts, group delay, Smith chart, etc., of the DUT.

The network analyzer may further be used to obtain a time domain response, such as a time domain reflectometry (TDR), of the DUT. In such a situation, for example, the frequency domain data indicating the transfer function of the DUT may be inverse Fourier transformed into time domain data. Prior to the inverse transform, a window function may be provided to the transfer function in the frequency domain. Consequently, it is possible to analyze a time domain response of the DUT, such as an impulse response without actually applying an impulse to the DUT.

Generally, such a Fourier transform method is based on what is called a discrete Fourier transform where a DUT response is measured in terms of discrete harmonics determined by a sequence of equally spaced samples. A discrete Fourier transform generally requires a large number of calculations. In particular, for N measured data points, $N^2$ transform coefficients are calculated. Consequently, for large data sets, the discrete transform process may take a long time to complete the calculation.

To address this issue, a high speed Fourier transform method, the so-called Fast Fourier Transform or FFT, was developed by J. W. Cooly and J. W. Tukey. FFT is an algorithm, typically implemented on a computer, used to reduce the number of calculations required to obtain a DFT. In essence, an FFT algorithm reduces the number of calculations of a typical DFT by eliminating redundant operations when dealing with Fourier series. As a result, according to the FFT, the number of operations required is represented by $N \log_2 N$ where N is the number of data samples to be transformed. Thus, the FFT requires significantly fewer calculations than that required in the DFT, and for large data arrays, the FFT is considerably faster than the conventional DFT.

Figure 8:
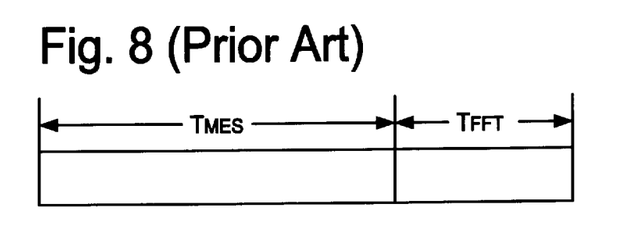
FIG. 8 is a timing chart showing an operation of a conventional FFT transform.

There are some drawbacks to FFT methods. First is that the FFT requires the number N of a transform array to be equal to a power of 2, which may prove restrictive for some applications. More importantly however, in general it is very difficult to initiate the FFT transform until all of the N sampled data are taken. Thus, an overall time required for the Fourier transform operation is represented by $T_{MES}+T_{FFT}$ as shown in FIG. 8, where $T_{MES}$ is a measuring time for obtaining all of the sampled data and $T_{FFT}$ is a Fourier transformation time by the FFT algorithm.

Figure 9:
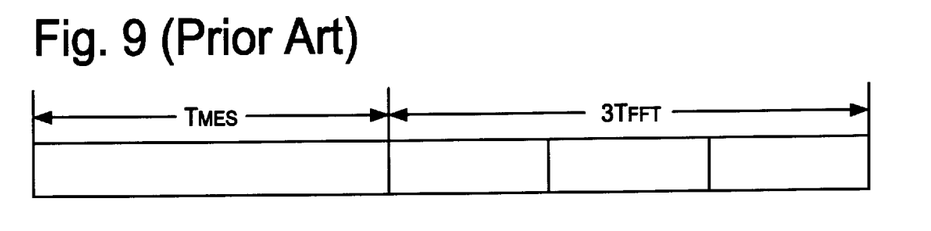
FIG. 9 is a timing chart showing an operation of a conventional Chirp-Z transform.

There is another type of Fourier transform process called Chirp Z transform, which is an improved version of FFT, that can perform Fourier transform with higher resolution than that of FFT. Another advantage of the Chirp Z transform is that the number of data samples need not be equal to a power of 2. This Fourier transform method is described by Rabiner and Gold in "Theory and Application of Digital Signal Processing", pages 393–398, 1975. As far as a transformation time is concerned, since the Chirp Z transform process typically carries out the FFT process three times, a transformation time of $3T_{FFT}$ must be added to the measuring time $T_{MES}$ as shown in FIG. 9. In other words, the Chirp Z transform requires a longer Fourier transformation time than that required in the traditional FFT process.

SUMMARY OF THE INVENTION

Therefore, it is an object of the present invention to provide a high-speed Fourier transform method and apparatus that is able to overcome the drawbacks in the conventional Fourier transform technology.

It is another object of the present invention to provide a high speed Fourier transform apparatus and method which is able to complete a Fourier transform by a shorter time than that required in the conventional FFT process when including a measuring time $T_{MES}$.

It is a further object of the present invention to provide a high speed Fourier transform apparatus and method wherein a discrete Fourier transform process is carried out in a real time fashion while obtaining sampled data.

It is a further object of the present invention to provide a high speed Fourier transform apparatus and method wherein a discrete Fourier transform process is carried out in a parallel fashion for each term in Fourier equation.

It is a further object of the present invention to provide a network analyzer using the high speed Fourier transform method wherein a discrete Fourier transform process is carried out in a parallel fashion for each term in Fourier equation.

The high speed Fourier transform method and apparatus of the present invention is basically a parallel discrete Fourier transform newly developed by the applicant of the present invention. The high speed Fourier transform of the present invention is based on the fact that the same order of terms in a plurality of Fourier equations can be determined independently from the other terms based on sampled data corresponding to the order of the terms. An overall Fourier transform is a sum of all of the terms in the equations. The present invention also takes into consideration the recent increases in operational speeds of digital processing devices.

The high speed Fourier transform apparatus comprises a discrete Fourier transform means for calculating corresponding terms in a plurality of Fourier equations upon acquisition of a portion of sampled data. The terms correspond to a sequence of sampled data counting from the start of measurement operation. The apparatus also comprises a calculation result file that stores the results of calculation corresponding to the terms in the plurality of Fourier equations. The apparatus further comprises an adder for adding the calculation results in the calculation result file in such a way to complete each and all of the plurality of discrete Fourier equations.

In accordance with the invention, a sweep frequency signal is applied to a device to be tested. An output signal level of the device under test is measured for each of N predetermined frequency intervals in the frequency sweep. Measuring the signal levels N times by this procedure produces N samples of frequency data. The discrete Fourier transform process of the present invention is carried out for same-order terms of N Fourier equations upon acquisition of a corresponding order of sampled data by the above measurement process. The order of sampled data may be defined with reference to the number of measurements from the start of the measurement process. The calculation process for the same terms in the Fourier equations is performed in real time upon obtaining the sampled data and before obtaining the next sampled data. Thus for each measured data, N discrete Fourier terms are calculated before the next measured data is obtained. Moreover, an (N×1) array of Fourier transform terms can be attained upon acquisition of each data point. Due to the high speed of recent digital processing devices, it is possible to calculate N discrete Fourier transform terms faster than the sweep time interval of analog frequency sweep generators.

When the last measurement data is acquired, only N-th discrete Fourier transform terms are calculated to complete all of the discrete Fourier transform terms for N transformed data points. The overall Fourier transform result is obtained when the calculated terms are summed in accordance with the discrete Fourier transform equations.

In accordance with the present invention, the total transform process is completed within $T_{MES}+T_{DFT}$, wherein the time $T_{DFT}$ needed for calculation of the last (N-th) terms of Fourier transform equations. Thus, the Fourier transform result is obtained after only a short interval past completion of the measurement. The present invention is particularly advantageous when the time $T_{DFT}$ needed for the calculation of N Fourier transform terms is shorter than the time $\Delta t$ for each measurement point.

These and other objects and advantages of the present invention will become apparent in the following detailed description taken in conjunction with the accompanied drawings.

DETAILED DESCRIPTION OF THE PREFERRED EMBODIMENTS

Figure 1:
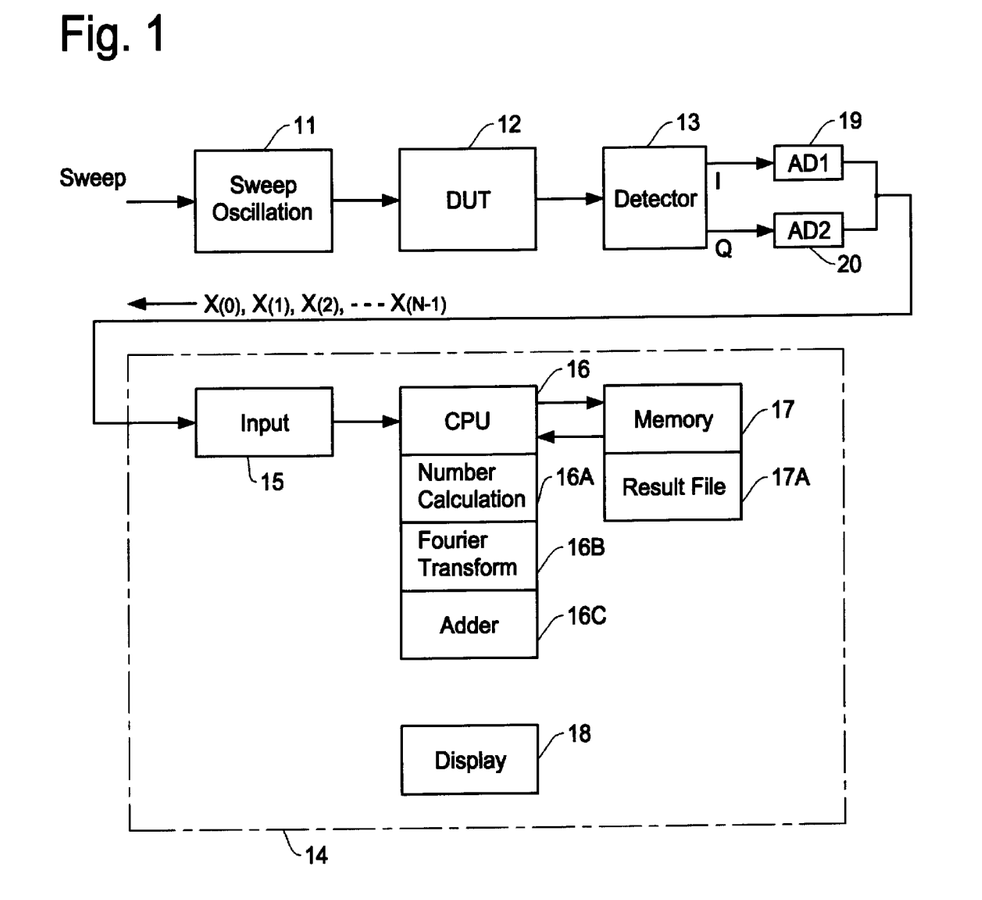
FIG. 1 is a block diagram of a basic embodiment of the high-speed Fourier transform apparatus of the present invention.

FIG. 1 shows an embodiment of a Fourier transform apparatus of the present invention. A frequency sweep oscillator 11 provides a sweep frequency signal to a circuit 12 to be tested (DUT). An output signal of the circuit 12 to be tested is input to a detector circuit 13. The detector circuit 13 obtains a real part and an imaginary part of the output signal at predetermined frequencies generated by the frequency sweep oscillator 11. The frequencies for testing may range from substantially DC to microwave frequencies, and are particularly suitable for radio frequency operation. It will be appreciated by those skilled in the art, that the sweep frequency oscillator may supply discrete frequencies to the DUT. Analog-to-digital (AD) converters AD1 (19) and AD2 (20) respectively receive the real part and the imaginary part from the detector circuit 13 and convert them to digital signals.

A high-speed Fourier transformer 14 receives the digital data from the AD converters. The input data comprise complex number measurement values (heretofore, measurement values $x_{(0)}, x_{(1)}, x_{(2)}, \ldots x_{(N-1)}$), and the Fourier transformer 14 performs a high speed discrete Fourier transform process on the received digital data. Thus, the frequency domain data is converted to the time domain data by the Fourier transform (more conventionally, an inverse Fourier transform) process.

Figure 2:
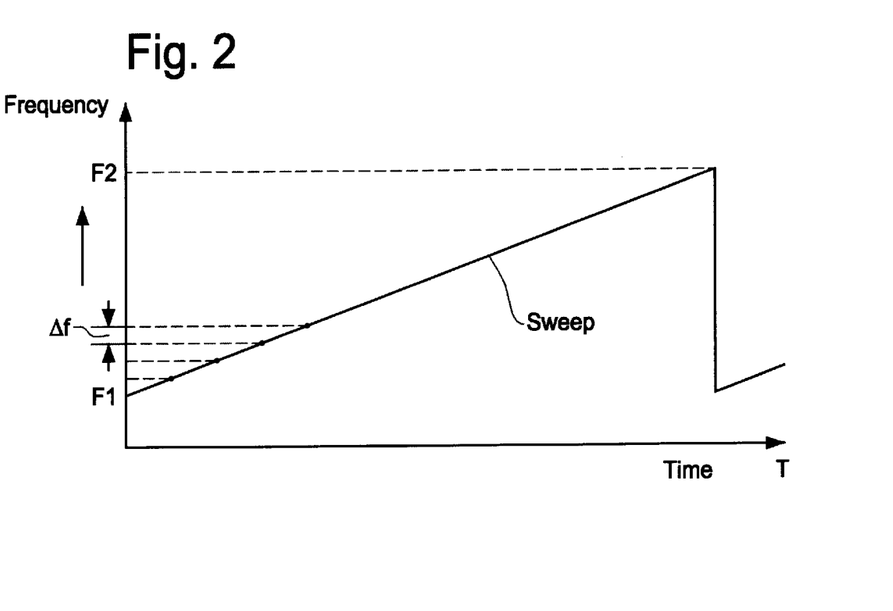
FIG. 2 is a schematic diagram showing the frequency sweep signal of the high-speed Fourier transform apparatus of FIG. 1.

As shown in FIG. 2, the frequency sweep signal oscillator 11 performs a frequency sweep procedure wherein the oscillation frequency linearly increases from F1 to F2 along with the passage of time T.

Figure 3:
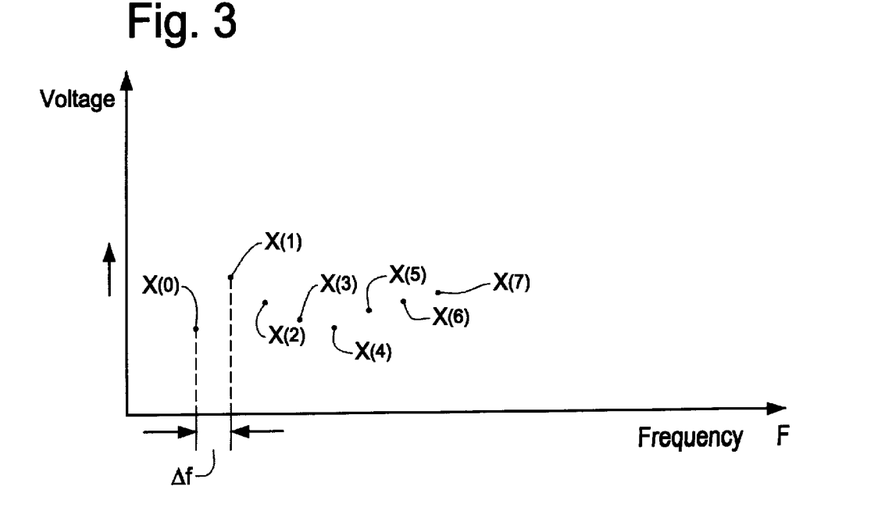
FIG. 3 is a schematic diagram showing an example of frequency domain data attained by the Fourier transform apparatus of FIG. 1.

The AD converter repeats the AD conversion operation at every constant time interval $\Delta t$, i.e., at a constant frequency step $\Delta f$ of FIG. 2. Assuming that the frequency sweep speed of the frequency sweep oscillator 11 is constant, each of the measured values $x_{(0)}, x_{(1)}, x_{(2)}, \ldots x_{(N-1)}$ obtained by the detector circuit 13 and AD converter corresponds to the measured values at the constant frequency interval $\Delta f$. Thus, the measured values $x_{(0)}, x_{(1)}, x_{(2)}, \ldots x_{(N-1)}$ can be regarded as the values that are measured for corresponding outputs of the circuit 12 under test for each frequency step $\Delta f$ as shown in FIG. 3.

The high-speed Fourier transformer 14 of the present invention performs a parallel discrete Fourier transform (PDFT) and is comprised of an input means 15 which is, for example a data buffer, a processing device 16 such as a digital signal processor or a general purpose, a memory 17 and an output means 18 such as a CRT monitor. The processing device 16 includes a measurement number calculator 16A, a Fourier transform term calculator 16B, and an adder 16C. In the preferred embodiment, the processing device 16 is configured by a digital signal processor TMS320C30 by Texas Instruments. The memory 17 includes a calculation result file 17A that stores data resulting from the calculation in the Fourier transform calculator 16B.

Figure 4:
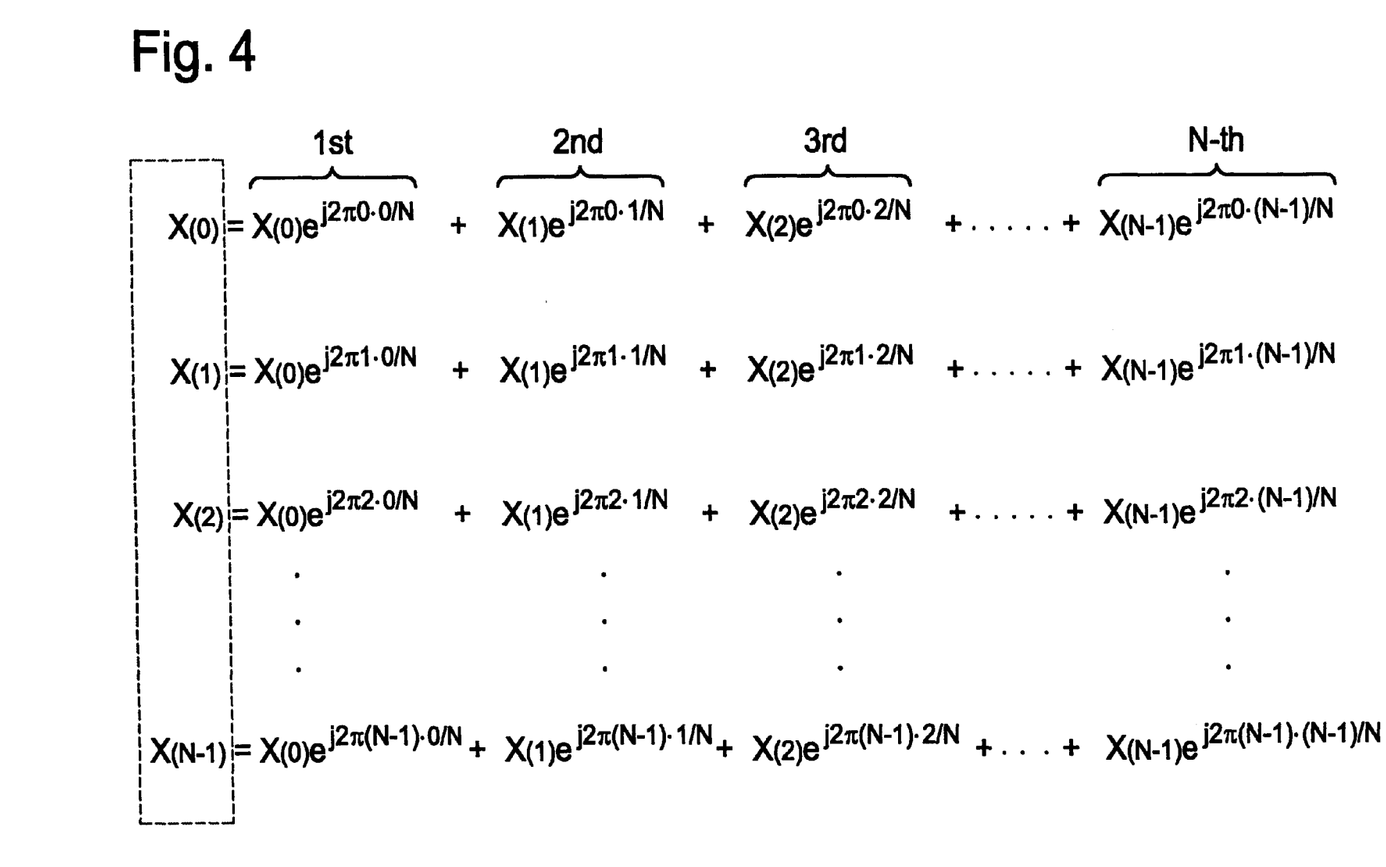
FIG. 4 is a schematic diagram showing equations employed in the discrete Fourier transform method of the present invention.
Figure 5:
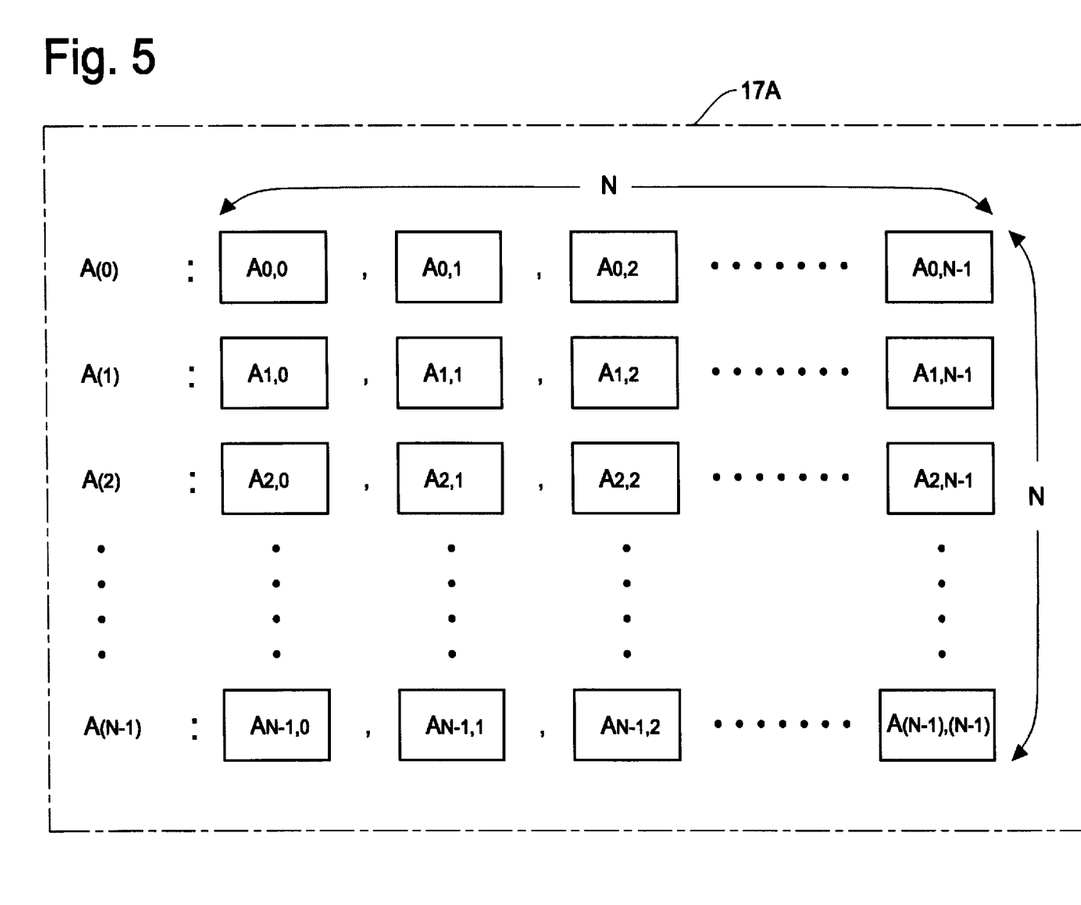
FIG. 5 is a schematic diagram showing an example of data in the calculation result file of the present invention.

FIGS. 4 and 5 explain the calculation result file 17A provided in the memory 17 and equations for the discrete Fourier transform. The equation of the discrete Fourier transform for converting the time domain data into the frequency domain data is:

$$X(n)=1/N\Sigma_{m=0}^{N-1}x_{(m)}\exp(-j2\pi n \cdot m/N) \quad (1)$$

Where X(n) are the complex amplitudes for N discrete frequencies. Conversely, when frequency domain data is transformed into time domain data:

$$X(n)=\Sigma_{m=0}^{N-1}x_{(m)}\exp(j2\pi n \cdot m/N) \quad (2)$$

Since the embodiment of FIG. 1 shows the case where the frequency domain data is transformed to the time domain data, the following explanation is based on the equation (2). It will be appreciated by those skilled in the art that the principles of the present invention may be applied for either transformation direction.

In the equation (2), X(n) is the array resulting from the Fourier transform process. The transformation equation (2) can be expressed by a plurality of equations as shown in FIG. 4 for each element of the array X(n), where each element represents a point in the time domain. The right-hand side of the equations shows groups of terms in the equations to be calculated when the corresponding measured value (frequency domain sample) $x_{(m)}$ is obtained.

One distinguishing feature of the present invention is that in the plurality of equations in FIG. 4, N Fourier transform terms are calculated every time each of the measured values $x_{(0)}, x_{(1)}, x_{(2)}, \ldots x_{(N-1)}$ is obtained.

To carry out the Fourier transform process, the present invention comprises the measurement number calculator 16A and the Fourier transform term calculator 16B. Every time the measurement data $x_{(0)}, x_{(1)}, x_{(2)}, \ldots$ or $x_{(N-1)}$ is obtained, the measurement number calculator 16A increments by one (1) so as to count the number of data received through the detector circuit 13 and AD converter.

The Fourier transform term calculator 16B specifies the number of terms in the Fourier equations according to the data number from the number calculator 16A. The Fourier transform term calculator 16B then executes the calculation corresponding to the specified terms in the Fourier transform equations. This calculation is carried out for the same order of terms in the equations, i.e., for each column of equations in FIG. 4. The results of the calculation for the corresponding terms of the Fourier equations are stored in the calculation result file 17A in the memory 17.

FIG. 5 shows the configuration of the calculation result file 17A. Reference labels $A_{0,0}, \ldots, A_{(N-1),(N-1)}$ indicate the terms of the Fourier equations (FIG. 4) stored in the calculation result file 17A. In the example of FIG. 5, first annex of each data A represents the order of the time domain point, the second annex of each data A represents the order of data sample.

When the first measurement data $x_{(0)}$ is provided from the AD converter, the measurement number calculator 16A sets the measurement number n as n=0 as an initial setting. The measurement number calculator 16A notifies the Fourier transform term calculator 16B that the first terms of the equations should be calculated. The Fourier transform term calculator 16B executes the calculation for the first terms of the Fourier equations in FIG. 4, i.e., $x_{(0)}e^{j2\pi 0 \cdot 0/N}$, $x_{(0)}e^{j2\pi 1 \cdot 0/N}, x_{(0)}e^{j2\pi 2 \cdot 0/N}, \ldots x_{(0)}e^{j2\pi(N-1) \cdot 0/N}$ in the first column of the Fourier transform equations in FIG. 4. The calculation results are stored in the first column, i.e., $A_{0,0}, A_{1,0}, \ldots A_{N-1,0}$, of the calculation result file 17A shown in FIG. 5.

When the second measurement data $x_{(1)}$ is provided from the AD converter, the measurement number calculator 16A sets the measurement number to n=1 indicating that the data resulted from the second measurement. The measurement number calculator 16A notifies the Fourier transform term calculator 16B that the second terms of the equations should be calculated. The Fourier transform term calculator 16B executes the calculation for the second terms of the Fourier equations in FIG. 4, i.e., $x_{(1)}e^{j2\pi 0 \cdot 1/N}$, $x_{(1)}e^{j2\pi 1 \cdot 1/N}, x_{(1)}e^{j2\pi 2 \cdot 1/N}, \ldots x_{(1)}e^{j2\pi(N-1) \cdot 1/N}$ in the second column of the Fourier transform equations in FIG. 4. The calculation results are stored in the second column, i.e., $A_{0,1}, A_{1,1}, \ldots A_{N-1,1}$, of the calculation file 17A shown in FIG. 5.

In this manner, in accordance with the present invention, the Fourier transform calculation is executed for each column of the terms when the AD converter 13 outputs measurement data $x_{(0)}, x_{(1)}, x_{(2)}, \ldots$ or $x_{(N-1)}$. The calculation preferably completes before the next measurement data is received by the high-speed Fourier transform apparatus 14, for example within Δt of FIG. 6. Hence, the calculation for only the last column of the terms needs to be performed when the last measurement data $x_{(N-1)}$ is received. The calculation results are stored in the corresponding memory locations of the calculation result file 17A shown in FIG. 5. Lastly, the adder means 16C adds the variables in the file 17A to complete each of the Fourier transform equations to attain transform results X(0), X(1), ... X(N-1), respectively. The final results of the Fourier transformation will be displayed by the output means 18 in a form of numerical sequence or a graph.

Figure 6:
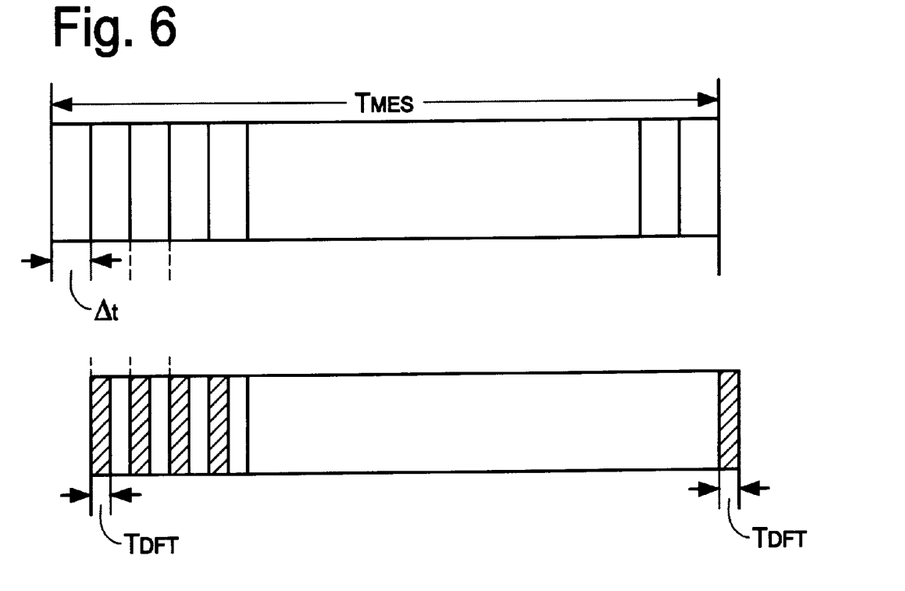
FIG. 6 is a timing chart showing operational timings in the high-speed Fourier transform apparatus of the present invention.

Preferably the Fourier term calculations are completed within the measurement time interval Δt of the detector and converter. Thus, an overall time needed for the Fourier transform in the high-speed Fourier transform apparatus 14 of the present invention is $T_{MES}+T_{DFT}$, wherein $T_{MES}$ designates a time required for measuring the entire input data from $x_{(0)}$ to $x_{(N-1)}$ by the detector and AD converter and $T_{DFT}$ designates a time required for the last calculation process as shown in FIG. 6.

When the number of data, i.e., the number of measurement points N for the circuit under test 12 is 200 for example, the calculation for each column of the terms can be completed in about 200 microsecond using a DSP (Digital Signal Processor) that operates at a 50 MHz clock rate typically available in the market. Thus, by setting the sweep step interval Δt in the sweep signal oscillator 11 to about 1 millisecond and the AD conversion speed to match the sweep step interval, the calculation for each column of terms in the Fourier equations will be completed within each measurement time interval Δt between any two measurement values $x_{(0)}, x_{(1)}, x_{(2)} \ldots x_{(N-1)}$.

As explained above, the calculation time $T_{DFT}$ for all the terms in the same column of the Fourier equations is carried out in a substantially shorter time, such as 200 microsecond, by a typical DSP in the market, than the sweep step interval Δt of the sweep signal oscillator 11, such as 1 millisecond. Consequently, in accordance with the present invention, the time required for the overall Fourier transform process is substantially equal to the measurement time $T_{MES}$ as shown in FIG. 6. Thus, the method and apparatus of the present invention is capable of performing data acquisition and transformation at a higher speed than a conventional FFT process.

Figure 7:
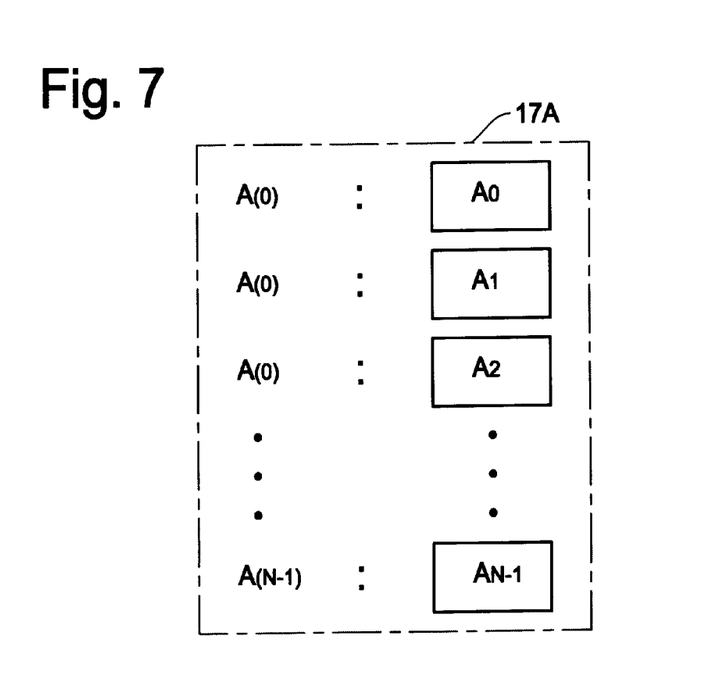
FIG. 7 is a schematic diagram showing an example of data in the calculation result file in a modified embodiment of the present invention.

In the foregoing embodiment, there are memory locations in the calculation result file 17A which correspond to the terms in the Fourier transform equations, which store the variables $A_{0,0} \ldots A_{(N-1),(N-1)}$ resulting from the calculation. However, other methods for storing and managing the calculated terms are also possible. For example, upon completion of a calculated set of Fourier terms, they may be added to the previous calculation result in each Fourier transform equation. In this embodiment, as shown in FIG. 7, the memory locations in the data file 17A (FIG. 1) may now be a one-dimensional array, $A_0, A_1, A_2, \ldots A_{N-1}$, for storing the summed Fourier terms corresponding to each of N Fourier equations.

Another preferred embodiment of the present invention comprises calculating the Fourier terms of a DFT in successive groups of a plurality of data points. Under such conditions, advantageous use can be made of redundant calculations found in a plurality of successive Fourier terms, thus lowering the number of computations. By replacing $\exp^{(j2\pi n \cdot m/N)}$ in the equation (2) with $W_{n:m}$, the set of DFT equations in FIG. 4 will be expressed as:

$$X(0) = x_{(0)}W_{0:0} + x_{(1)}W_{0:1} + x_{(2)}W_{0:2} + \ldots + x_{(N-1)}W_{0:N-1}$$

$$X(1) = x_{(0)}W_{1:0} + x_{(1)}W_{1:1} + x_{(2)}W_{1:2} + \ldots + x_{(N-1)}W_{1:N-1}$$

$$X(2) = x_{(0)}W_{2:0} + x_{(2)}W_{2:1} + x_{(2)}W_{2:2} + \ldots + x_{(N-1)}W_{2:N-1}$$

$$X(N-1) = x_{(0)}W_{N-1:0} + x_{(1)}W_{N-1:1} + x_{(2)}W_{N-1:2} + \ldots + x_{(N-1)}W_{N-1:N-1} \quad (3)$$

In performing the Fourier transformation for each term in the above equation, such as $x_{(2)}W_{0:2}$ in the first equation, eight (8) computations are necessary. This is because a multiplication of two complex numbers is expressed as:

$$(a+jb)(c+jd) = (ac-bd) + j(ad+bc) \quad (4)$$

which includes four (4) multiplication and two (2) addition. It is also necessary to perform two (2) accumulation operations to add the calculation results to the previous results in real and imaginary parts. Thus, an overall number of computations for each term of the equations is eight (8).

For reducing the number of computations in the discrete Fourier transform, a case is considered wherein three successive terms are calculated at the same time. The three terms in the equation (3) may be written in a general form:

$$x_{(n-1)}W_{0:n-1} + x_{(n)}W_{0:n} + x_{(n+1)}W_{0:n+1} \quad x_{(n-1)}W_{1:n-1} + x_{(n)}W_{1:n} + x_{(n+1)}W_{1:n+1}$$

$$x_{(n-1)}W_{n-1:n-1} + x_{(n)}W_{n-1:n} + x_{(n+1)}W_{n-1:n+1} \quad x_{(n-1)}W_{n:n-1} + x_{(n)}W_{n:n} + x_{(n+1)}W_{n:n+1}$$

$$x_{(n-1)}W_{n+n:n-1} + x_{(n)}W_{n+1:n} + x_{(n+1)}W_{n+1:n+1} \quad x_{(n-1)}W_{N-1:n-1} + x_{(n)}W_{N-1:n} + x_{(n+1)}W_{N-1:n+1} \quad (5)$$

The above set of expression (5) may be modified to:

$$W_{0:n}\{W_{0:-1}x_{(n-1)} + x_{(n)} + W_{0:1}x_{(n+1)}\} W_{1:n}\{W_{1:-1}x_{(n-1)} + x_{(n)} + W_{1:1}x_{(n+1)}\}$$

$$W_{n-1:n}\{W_{n-1:-1}x_{(n-1)} + x_{(n)} + W_{n-1:1}x_{(n+1)}\} W_{n:n}\{W_{n:-1}x_{(n-1)} + x_{(n)} + W_{n:1}x_{(n+1)}\}$$

$$W_{n+1:n}\{W_{n+1:-1}x_{(n-1)} + x_{(n)} + W_{n+1:1}x_{(n+1)}\} W_{N-1:n}\{W_{N-1:-1}x_{(n-1)} + x_{(n)} + W_{N-1:1}x_{(n+1)}\} \quad (6)$$

Since $W_{n:-1} = W_{n:1}^*$ where * indicates the complex conjugate, the above set of expression (6) may further be rewritten:

$$W_{0:n}\{W_{0:1}^*x_{(n-1)} + x_{(n)} + W_{0:1}x_{(n+1)}\} W_{1:n}\{W_{1:1}^*x_{(n-1)} + x_{(n)} + W_{1:1}x_{(n+1)}\}$$

$$W_{n-1:n}\{W_{n-1:1}^*x_{(n-1)} + x_{(n)} + W_{n-1:1}x_{(n+1)}\} W_{n:n}\{W_{n:1}^*x_{(n-1)} + x_{(n)} + W_{n:1}x_{(n+1)}\}$$

$$W_{n+1:n}\{W_{n+1:1}^*x_{(n-1)} + x_{(n)} + W_{n+1:1}x_{(n+1)}\} W_{N-1:n}\{W_{N-1:1}^*x_{(n-1)} + x_{(n)} + W_{N-1:1}x_{(n+1)}\} \quad (7)$$

To convert each of the expressions (7) to a form having a sum of a real part and an imaginary part, the expression emphasized above is considered in the following:

$$W_{n:n}\{W_{n:1}^*x_{(n-1)} + x_{(n)} + W_{n:1}x_{(n+1)}\} \quad (8)$$

For simplicity of explanation, "n" in the data x is omitted so that the expression (8) may be rewritten:

$$W_{n:n}\{W_{n:1}^*x_{-1} + x_0 + W_{n:1}x_{+1}\} \quad (9)$$

To develop the expression (9) to a form having a real part and an imaginary part, we obtain:

$$W_{n:n}[\{x_0 + W_{n:1r}(x_{-1r} + x_{1r}) + W_{n:1i}(x_{-1i} - x_{1i})\} + j\{W_{n:1i}(x_{-1r} + x_{1i}) + W_{n:1i}(x_{1r} - x_{-1r})\}] \quad (10)$$

Making the substitution $x_{+r} = x_{-1r} + x_{1r}$, $x_{+i} = x_{-1i} + x_{1i}$, $x_{-r} = x_{-1r} - x_{1r}$, $x_{-i} = x_{-1i} - x_{1i}$, the formula (10) will be expressed as follows:

$$W_{n:n}\{x_{0r} + W_{n:1r}x_{+r} + W_{n:1i}x_{-i} + j(x_{0i} + W_{n:1r}x_{1i} - W_{n:1i}x_{-r})\} \quad (11)$$

Therefore, the set of expression (7) is rewritten in the same manner as the formula (11) consisting of the sum of real and imaginary parts as follows:

$$W_{0:n}\{x_{0r} + W_{0:1r}x_{+r} + W_{0:1i}x_{-i} + j(x_{0i} + W_{0:1r}x_{1i} - W_{0:1i}x_{-r})\}$$

$$W_{1:n}\{x_{0r} + W_{1:1r}x_{+r} + W_{1:1i}x_{-i} + j(x_{0i} + W_{1:1r}x_{1i} - W_{1:1i}x_{-r})\}$$

$$W_{n-1:n}\{x_{0r} + W_{n-1:1r}x_{+r} + W_{n-1:1i}x_{-i} + j(x_{0i} + W_{n-1:1r}x_{1i} - W_{n-1:1i}x_{-r})\}$$

$$W_{n:n}\{x_{0r} + W_{n:1r}x_{+r} + W_{n:1i}x_{-i} + j(x_{0i} + W_{n-1:1r}x_{1i} - W_{n-1:1i}x_{-r})\}$$

$$W_{n+1:n}\{x_{0r}W_{n+1:1r}x_{+r} + W_{n+1:1i}x_{-i} + j(x_{0i} + W_{n+1:1r}x_{1i} - W_{n+1:1i}x_{-r})\}$$

$$W_{N-1:n}\{x_{0r} + W_{N-1:1r}x_{+r} + W_{N-1:1i}x_{-i} + j(x_{0i} + W_{N-1:1r}x_{1i} - W_{N-1:1i}x_{-r})\} \quad (12)$$

In the parenthesis { } in each of the formulas (12), the required number of computations consists of four (4) multiplication and four (4) addition. After this process, each of the formulas (12) is in the form of the expression (4) above which requires four (4) multiplication and two (2) addition. It is also necessary to perform two (2) accumulation operations to add the calculation results to the previous results both in real and imaginary parts, respectively. Thus, an overall number of computations for each formula (12) is sixteen (16) for three successive terms. It should be noted that it requires 24 computations for three terms of each equation as discussed with reference to formula (4) if there is no simplification measure employed in the parallel DFT operation. After calculating the three terms in this manner, the fast Fourier transform apparatus of the present invention calculates the next three terms. This process repeats until all of the terms are calculated for every three terms.

Furthermore, it will also be appreciated that since $W_{N-m:n} = W_{m:n}^*$, further simplification may be found through eliminating other redundant operations. For example, the last line of the expression (12) is:

$$W_{N-1:n}\{x_{0r} + W_{N-1:1r}x_{+r} + W_{N-1:1i}x_{-i} + j(x_{0i} + W_{N-1:1r}x_{1i} - W_{N-1:1i}x_{-r})\}$$

which may be converted to:

$$W_{1:n} \cdot \{x_{0r} + W_{1:1,r}x_{+r} - W_{1:1,r}x_{-r} + j(x_{0i} + W_{1:1,r}x_{1i} + W_{1:1,r}x_{-r})\} \quad (13)$$

while the second line of the expression (12) is:

$$W_{1:n}\{x_{0r} + W_{1:1,r}x_{+r} + W_{1:1,r}x_{-r} + j(x_{0i} + W_{1:1,r}x_{1i}W_{1:1,r}x_{-r})\} \quad (14)$$

Between the expressions (13) and (14), it is seen that there are six (6) identical computations. Therefore, once such computations are obtained for the first expression (13), then the same computation need not be performed for the latter expression (14). This rule equally applies to other pairs of expressions, which is further able to reduce the number of computations. In this example, six (6) computations are common between the two expressions, thus, three (3) computations may further be reduced for each expression, resulting in thirteen (13) overall operations. Therefore, in contrast to the first embodiment of the present invention which requires twenty four (24) operations for three consecutive terms in each Fourier equation, significant reduction of computation (from 24 to 13) can be achieved in the second embodiment.

Figure 10:
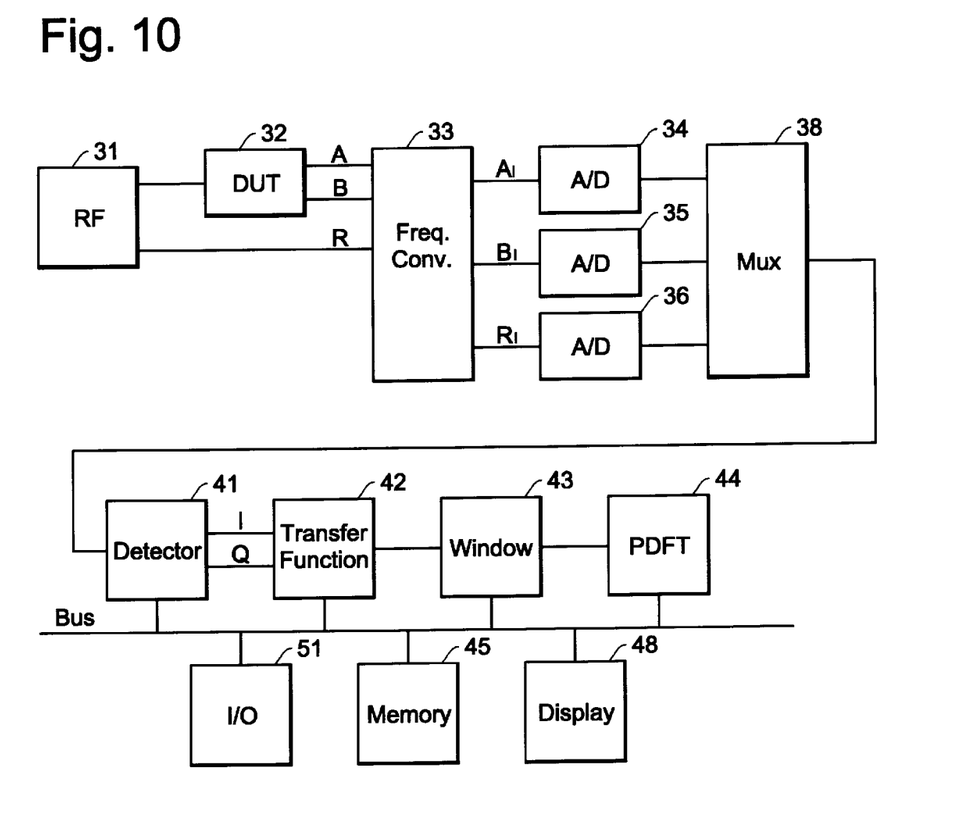
FIG. 10 is a schematic block diagram showing an example of structure of a network analyzer to incorporate the high-speed Fourier transform apparatus of the present invention.

The foregoing description of the high speed DFT apparatus is advantageously applied to a preferred network analyzer as shown schematically in FIG. 10. An RF signal source 31, such as a frequency sweep oscillator, provides a sweep frequency signal to a device under test (DUT) 32. For example, such a frequency sweep is performed by a step sweep manner where a large number of frequency steps forms a substantially linear change of frequency such as shown in FIG. 2. The number of frequency steps (measurement points) corresponds to the number of data points N for the discrete Fourier transform described in the foregoing. The RF signal source 31 also generates a reference signal R which is, for example, identical to the sweep frequency signal provided to the DUT 32 to be used as a level and phase reference.

An output signal (test signal) of the DUT 32 is input to a frequency converter 33. In this example, the frequency converter 33 receives two test signals A and B from the DUT 32 through a directional bridge or coupler (not shown). An example of such two signal includes a transmission signal and a reflection signal from the DUT 32. The frequency converter 33 also receives the reference signal R from the RF signal source 31 and converts the received signals A, B and R to corresponding intermediate frequency test signals $A_I$, $B_I$, and an intermediate frequency reference signal $R_I$. Such a frequency conversion is carried out by a known process which incorporates, for example, frequency mixers or harmonic samplers to down-convert the frequency of an incoming signal to a difference from a local signal frequency.

A/D converters 34–36 receive the corresponding intermediate frequency signals $A_I$, $B_I$, and $R_I$ and convert the intermediate frequency test and reference signals to digital signals which are received by a multiplexer 38. The multiplexer 38 selectively provides the digital signals to a detector 41 which is for example a digital quadrature detector. The detector 41 detects in-phase (I) components (real parts) and quadrature (Q) components (imaginary parts) of the incoming digital signal. As is well known in the art, such a quadrature detector includes a pair of multipliers, one of which multiplies the input digital signal with a cosine local signal while the other multiplies the input signal with a sine local signal. A pair of low pass filters are also provided at the outputs of the corresponding multipliers.

A transfer function analyzer 42 receives the I and Q components from the digital quadrature detector 41 and analyzes them to obtain response parameters of the DUT 32 including a transfer function and a reflection coefficient. Typically, such response parameters are expressed by scattering (S) parameters, $S_{11}$, $S_{12}$, $S_{21}$, and $S_{22}$ as is well known in the art. The S parameters may be error corrected by error correction data stored in a memory 45 and displayed on a display 48 in a frequency domain format (frequency versus each parameter).

In the case where a user further wants to analyze a time domain response of the DUT 32 in a simulated fashion, the network analyzer includes a window 43 and a multiple term parallel discrete Fourier transformer (PDFT) 44. An example of such a time domain response is a time domain reflectometry (TDR) of the DUT in response to a simulated impulse signal. The frequency domain data obtained by the transfer function analyzer 42 may be modified by the window 43 in response to instructions by a user through an I/O 51. Examples of window functions are a rectangular window and a Hamming window. For example, an appropriate Hamming window in the frequency domain can effectively remove ringing in the time domain.

Figure 11A:
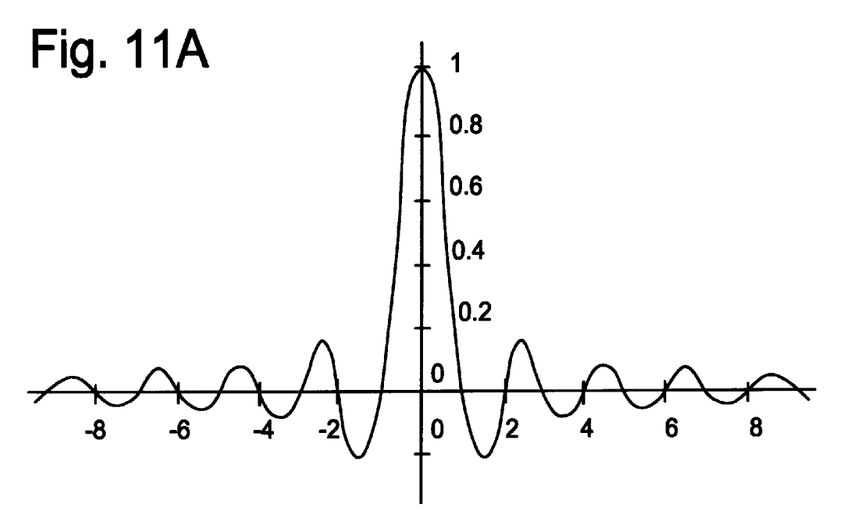
FIGS. 11A and 11B are diagrams showing examples of time domain impulse waveforms corresponding to window functions in the frequency domain.
Figure 11B:
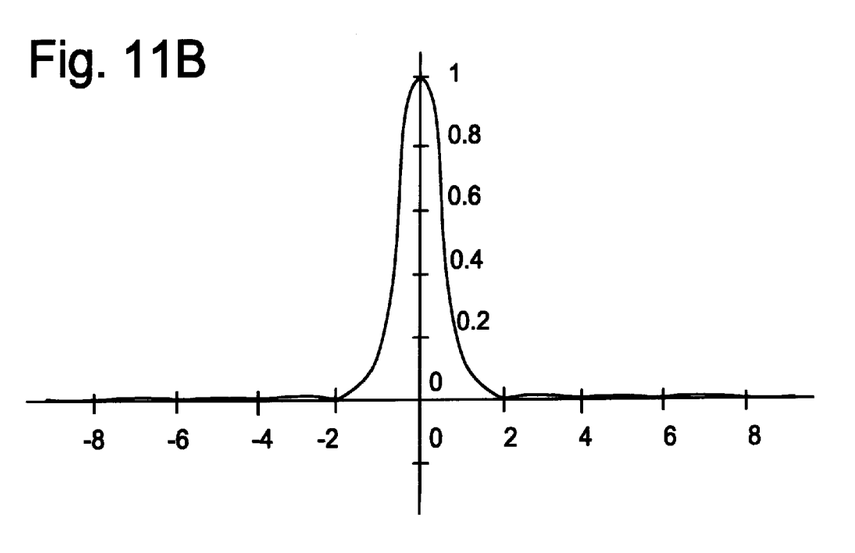

FIGS. 11A and 11B show examples of time domain waveforms corresponding to window functions in the frequency domain. FIG. 11A is a time domain impulse waveform when the window function in the frequency domain is a rectangular window. FIG. 11B is a time domain impulse waveform when the window function in the frequency domain is a Hamming window. Thus, for example, in the case where the Hamming window is multiplied by the transfer function in the frequency domain, the corresponding time domain waveform corresponds to a simulated response of the DUT when the impulse waveform of FIG. 11B is applied to the DUT in the time domain.

The window 43 calculates a transfer function of the DUT responsive to an RF source simulated by the specified window function using the frequency domain data from the transfer function analyzer 42, which may be displayed on the display 48. The PDFT 44 converts the calculated transfer function from the window 43 to time domain data. The PDFT 44 has basically the same structure as the high speed Fourier transformer 14 of FIG. 1 and performs the inverse Fourier transform as described with reference to the first, second or third embodiments. The number of calculations needed in the PDFT will be reduced in considering the redundancies of calculations in a plurality of terms and equations as discussed with respect to the second embodiment of the present invention. Thus, a preferred network analyzer utilizing the present high-speed DFT can produce the time-domain response of a DUT in substantially real time.

Moreover, using techniques well known in the art, vector error correction may be applied to the transfer function to correct errors introduced by the converter and other components in the network analyzer. The time domain output may also be gated directly in the time domain or by convolving a frequency domain representation of the gate with the output signal in the frequency domain.

The above description of the invention is made for the case wherein the frequency domain data is transformed to the time domain data. However, it will be appreciated that the high-speed Fourier transform method and apparatus of the present invention can also be used for transforming the time domain data the frequency domain data. Furthermore, the foregoing description of the preferred embodiments is provided by way of example and is not intended to limit the scope of the invention. It will be understood that various changes and modifications can be made therein without departing from the scope of the invention as defined in the appended claims.

What is claimed is:

1. A high-speed Fourier transform apparatus that performs a Fourier-transform using the operation equation of discrete Fourier transform, comprising:

data number calculator to count a data number every time test data is acquired for each test point;

Fourier transformer for executing operation for Fourier transform on a term common among a plurality of Fourier transform equations that is specified by said data number;

a calculation result file that stores the calculation results produced by said Fourier transformer for the same order of term among said plurality of Fourier equations; and an adder that adds each calculation result stored in said calculation result file so that each and all of said plurality of Fourier transform equations show final solutions;

wherein said calculation result file has storage areas corresponding to the number of said plurality of Fourier transform equations for storing a sum of said calculation results by adding previous calculation results to new calculation results for each term of Fourier equations obtained by said Fourier transformer.

2. A high-speed Fourier transform apparatus that performs Fourier-transform using the operation equation of discrete Fourier transform, comprising:

data number calculator to calculate a number of test data every time test data is acquired for each test point;

Fourier transformer for executing operation for Fourier transform on a plurality of terms common among a plurality of Fourier transform equations that is specified by said data number;

a calculation result file that stores the calculation results produced by said Fourier transformer for the same order of terms among said plurality of Fourier equations; and an adder that adds each calculation result stored in said calculation result file so that each and all of said plurality of Fourier transform equations show final solutions;

wherein said Fourier transformer eliminates redundancy of calculations in said plurality of terms in said Fourier transform equations.

3. A high-speed Fourier transform apparatus as defined in claim 2, wherein said plurality of terms is three so that computations for three terms common among said plurality of Fourier transform equations are carried out at the same time.

4. A high-speed Fourier transform device as defined in claim 2, wherein N test data are sequentially provided to said Fourier transformer wherein each of said data having a real part and an imaginary part, and said plurality of Fourier transform equations are formed of N discrete Fourier transform equations each of which includes N terms, wherein computations for three terms common among said plurality of Fourier transform equations are carried out by said Fourier transformer at the same time.

5. A network analyzer for analyzing the response of a device under test comprising:

a converter for digitizing a signal representative of the response of the device under test to an applied signal;

a transfer function analyzer coupled to the converter for processing the digitized signal in the frequency domain to calculate a transfer function of the device under test based on the response to the applied signal;

said transfer function analyzer also for calculating a frequency domain signal corresponding to the response of the device under test to a simulated signal based on the calculated transfer function; and a high-speed Fourier transform apparatus which executes parallel Fourier transform operations on at least one frequency domain sample common to a plurality of discrete Fourier transform (DFT) equations, said high-speed Fourier transform apparatus being connected to receive said frequency domain signal for converting said frequency domain to a time domain signal in substantially real time, wherein each DFT equation corresponds to an output time domain point.

6. A network analyzer as defined in claim 5, wherein said high-speed Fourier transform apparatus executes parallel Fourier transform operations on a plurality of frequency domain samples common to a plurality of DFT equations.

7. A network analyzer as defined in claim 6, wherein said plurality of frequency domain samples is three so that computations for three samples common to said plurality of DFT equations are carried out at the same time.

8. A network analyzer as defined in claim 6, wherein said high-speed Fourier transform apparatus executes parallel Fourier transform operations on three successive frequency domain samples common to said plurality of DFT equations.

* * * * *